United States Patent
Su et al.

(10) Patent No.: US 11,182,302 B2
(45) Date of Patent: Nov. 23, 2021

(54) MEMORY DEVICE, ELECTRONIC DEVICE, AND ASSOCIATED READ METHOD

(71) Applicant: MACRONIX INTERNATIONAL CO., LTD., Hsinchu (TW)

(72) Inventors: Chun-Lien Su, Taichung (TW); Shuo-Nan Hung, Zhubei (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/820,795

(22) Filed: Mar. 17, 2020

(65) Prior Publication Data

US 2020/0387454 A1 Dec. 10, 2020

Related U.S. Application Data

(60) Provisional application No. 62/857,826, filed on Jun. 6, 2019.

(51) Int. Cl.

| | |
|---|---|
| *G06F 12/08* | (2016.01) |
| *G06F 12/0882* | (2016.01) |
| *G06F 12/0862* | (2016.01) |
| *G11C 7/22* | (2006.01) |
| *G06F 9/30* | (2018.01) |
| *G06F 12/0893* | (2016.01) |

(52) U.S. Cl.
CPC ...... *G06F 12/0882* (2013.01); *G06F 9/30101* (2013.01); *G06F 12/0862* (2013.01); *G06F 12/0893* (2013.01); *G11C 7/22* (2013.01)

(58) Field of Classification Search
CPC ............ G06F 12/0882; G06F 12/0862; G06F 12/0893; G06F 9/30101; G11C 7/22
USPC ........................................................ 711/154
See application file for complete search history.

(56) References Cited

U.S. PATENT DOCUMENTS

| | | |
|---|---|---|
| 8,244,963 B2 | 8/2012 | Veh |
| 9,489,302 B2 | 11/2016 | Van Aken |
| 10,296,256 B2 | 5/2019 | Shah et al. |
| 10,691,342 B2 | 6/2020 | Chen et al. |
| 2011/0179249 A1* | 7/2011 | Hsiao .................. G06F 13/1673 711/206 |

(Continued)

FOREIGN PATENT DOCUMENTS

| | | |
|---|---|---|
| TW | 201235843 A | 9/2012 |
| TW | I435215 B | 4/2014 |

(Continued)

*Primary Examiner* — Hua J Song

(74) *Attorney, Agent, or Firm* — McClure, Qualey & Rodack, LLP

(57) ABSTRACT

A memory device, an electronic device, and associated read method are provided. The electronic device includes the memory device and a host device, which are electrically connected to each other. The memory device includes a NAND flash memory and a control logic. The NAND flash memory includes a first physical page, and the first physical page includes a plurality of first acquisition-units. The control logic is electrically connected to the NAND flash memory. The control logic receives a first-page address corresponding to the first physical page from a host device during a first page-read duration. Data stored at the plurality of first acquisition-units are respectively transferred to the host device during a second page-read duration.

21 Claims, 12 Drawing Sheets

(56) References Cited

U.S. PATENT DOCUMENTS

2017/0075759 A1\* 3/2017 Otsuka ............... G06F 11/1068
2019/0050167 A1 2/2019 Hsieh et al.

FOREIGN PATENT DOCUMENTS

| TW | I640864 B | 11/2018 |
| TW | I640920 B | 11/2018 |
| TW | I646546 B | 1/2019 |

\* cited by examiner

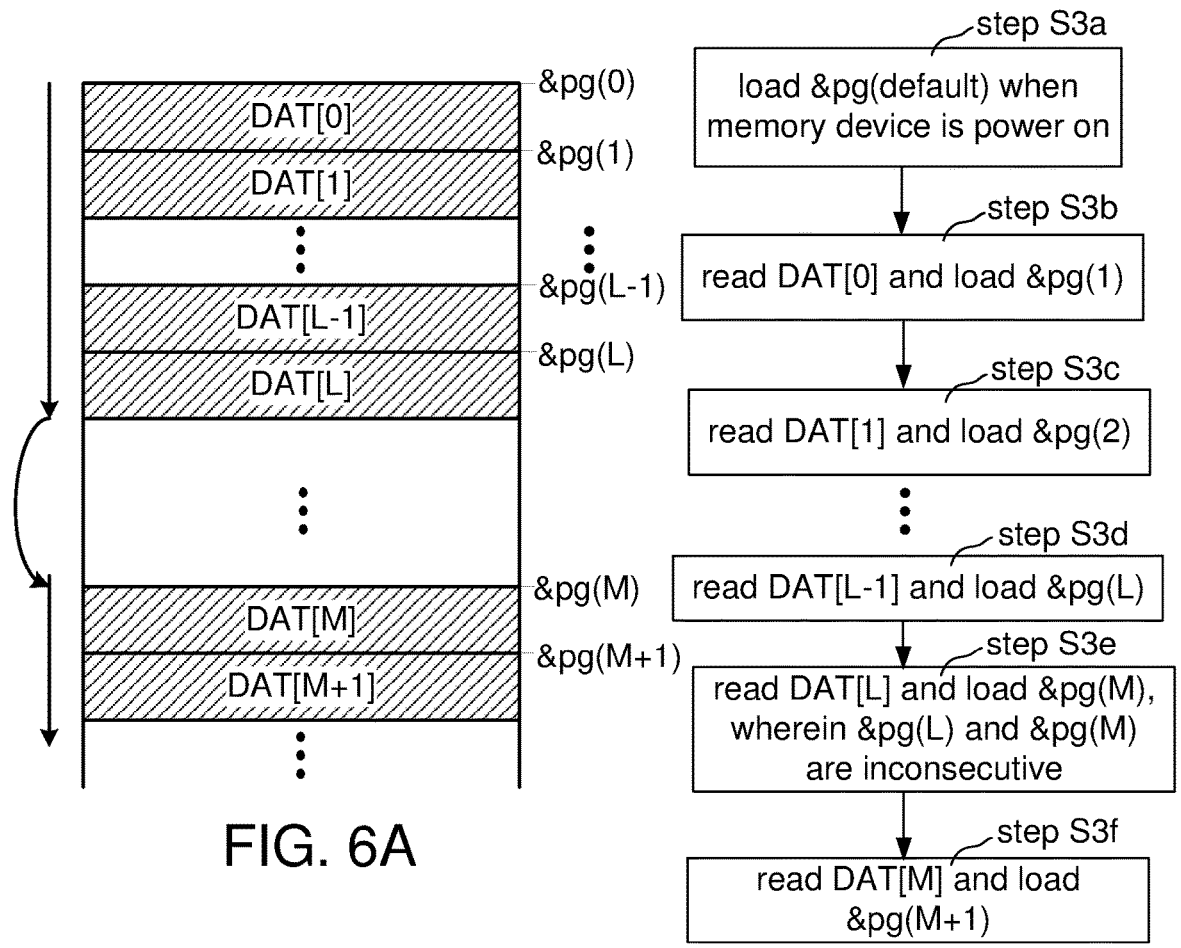
FIG. 6A
FIG. 6B
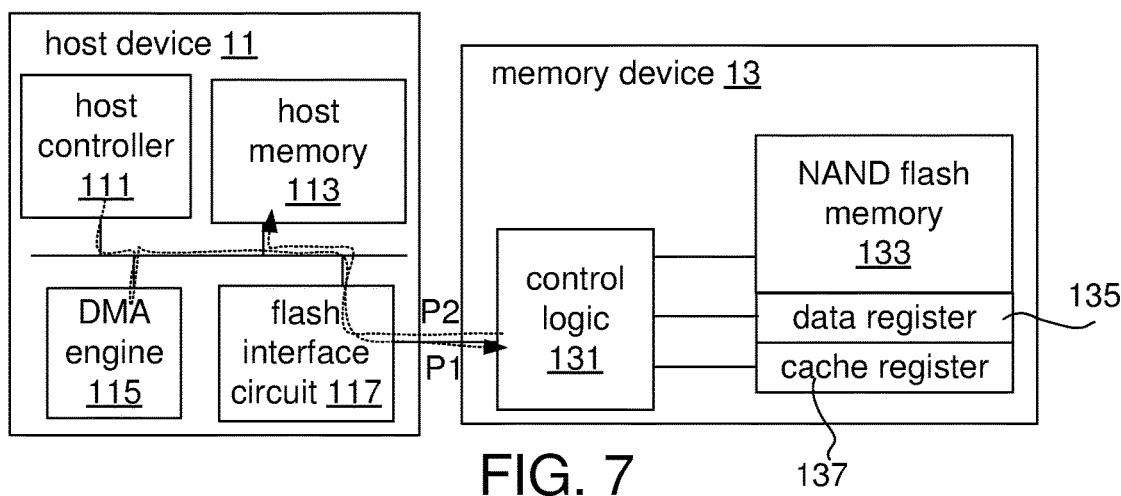
FIG. 7

MEMORY DEVICE, ELECTRONIC DEVICE, AND ASSOCIATED READ METHOD

This application claims the benefit of U.S. provisional application Ser. No. 62/857,826, filed Jun. 6, 2019, the disclosure of which is incorporated by reference herein in its entirety.

TECHNICAL FIELD

The disclosure relates in general to a memory device, an electronic device and associated read method, and more particularly to a memory device, an electronic device and an associated read method capable of randomly reading data stored at NAND flash memory in sizes that are smaller than a physical page.

BACKGROUND

Flash memory has been used widely due to the increasing popularity of mobile devices with large storage requirements. NAND flash memory architecture and NOR flash memory architecture basically dominate the non-volatile flash market. In short, NAND flash memory is ideal for high capacity data storage, and NOR flash memory is more used for code storage and execution.

With technology develops, size shrinking is an inevitable trend. However, size shrinking development of the NOR flash memory encounters bottlenecks, and the density of the NAND flash memory is higher than the NOR flash memory. Thus, the small cell size characteristic of the NAND flash memory is a significant advantage. The demand for using flash memory for program code and data in applications such as the internet of things (hereinafter, IoT) and artificial intelligence (hereinafter, AI) is growing, and there is a need to replace the NOR flash memory with the NAND flash memory in consumer and industrial applications.

There is a fundamental characteristic difference between the NOR and the conventional NAND flash memories. That is, the NOR flash memory allows random-access for reading, but the conventional NAND flash memory allows only consecutive page access. Therefore, some modifications of the NAND flash memory control mechanism are required to provide operations similar to NOR flash memory and provide the same user experience of NOR Flash, especially for those off-the-shelf systems.

SUMMARY

The disclosure is directed to a memory device, an electronic device and an associated read method capable of reading data stored at NAND flash memory in sizes smaller than a physical page and in a pseudo or small range random-access manner.

According to one embodiment, a memory device is provided. The memory device is electrically connected to a host device. The memory device includes a NAND flash memory and a control logic. The NAND flash memory includes a first physical page having a plurality of first acquisition-units. The control logic is electrically connected to the NAND flash memory. The control logic receives a first-page address corresponding to the first physical page from a host device during a first page-read duration. Data stored at the plurality of first acquisition-units are respectively transferred to the host device during a second page-read duration.

According to another embodiment, an electronic device is provided. The electronic device includes a host device and a memory device, which are electrically connected to each other. The memory device includes a NAND flash memory and a control logic. The NAND flash memory includes a first physical page having a plurality of first acquisition-units. The control logic is electrically connected to the NAND flash memory. The control logic receives a first-page address corresponding to the first physical page from the host device during a first page-read duration. Data stored at the plurality of first acquisition-units are respectively transferred to the host device during a second page-read duration.

According to an alternative embodiment, a read method applied to a memory device is provided. The memory device includes a control logic and a NAND flash memory, and the NAND flash memory includes a first physical page having a plurality of first acquisition-units. The read method includes the following steps. Firstly, a first-page address corresponding to the first physical page is received from a host device during a first page-read duration. Then, data stored at the plurality of first acquisition-units are respectively transferred to the host device during a second page-read duration.

BRIEF DESCRIPTION OF THE DRAWINGS

FIG. 6A is a schematic diagram illustrating that the memory device reads data from inconsecutive page addresses.

FIG. 6B is a flow diagram illustrating the operation sequence of the memory device that reads data from the data allocation shown in FIG. 6A.

FIG. 7 is a schematic diagram illustrating that a DMA operation is performed between the host device and the memory device.

Figure 1A:
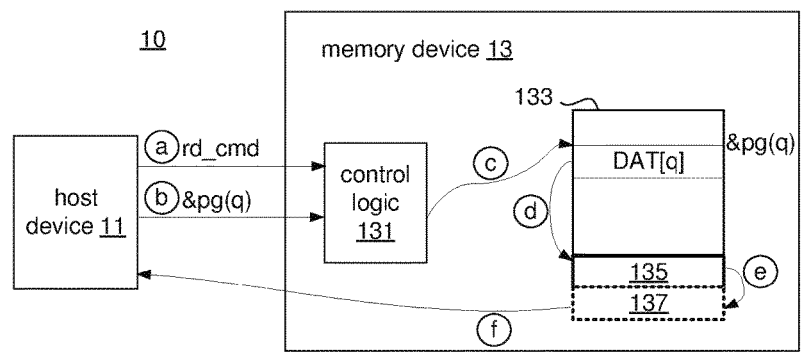
FIG. 1A is a schematic diagram illustrating the read operation of a memory device having NAND flash memory.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1A is a schematic diagram illustrating the read operation of a memory device having NAND flash memory. An electronic device 10 including a memory device 13 and a host device 11 is shown. The electronic device 10 can be, for example, a mobile, a digital camera, a laptop, and so forth.

In FIG. 1A, arrows, and circles with alphabets "a" to "g" is shown. The arrows indicate the transmission path of the command, address, or data. The circles with alphabets "a" to "f" are utilized to indicate the sequence of command, address, and data. Firstly, the host device 11 respectively transmits the read command rd_cmd and the q-th page address &pg(q) to the control logic 131 (steps (a) and (b)). Then, the control logic 131 passes the read request to the NAND flash memory 133 (step (c)).

From the NAND flash memory 133, the page data DAT[q], that is, the data stored at page address &pg(q), is firstly acquired (copied) from the NAND flash memory 133 to the data register 135 (step (d)). Then, the content of the data register 135 is transferred to the cache register 137 (step (e)). Once the page data DAT[q] is ready at the cache register 137, the host device 11 can read out the page data DAT[q] from the cache register 137.

For the sake of illustration, in the specification, a symbol of the page is abbreviated as "pg," an address is represented as an ampersand (&), and the data are represented with capital letters DAT and square brackets. For example, the page address of the n-th physical page is represented as &pg(n), and the page data stored at the n-th physical page is represented as DAT[n].

Figure 1B:
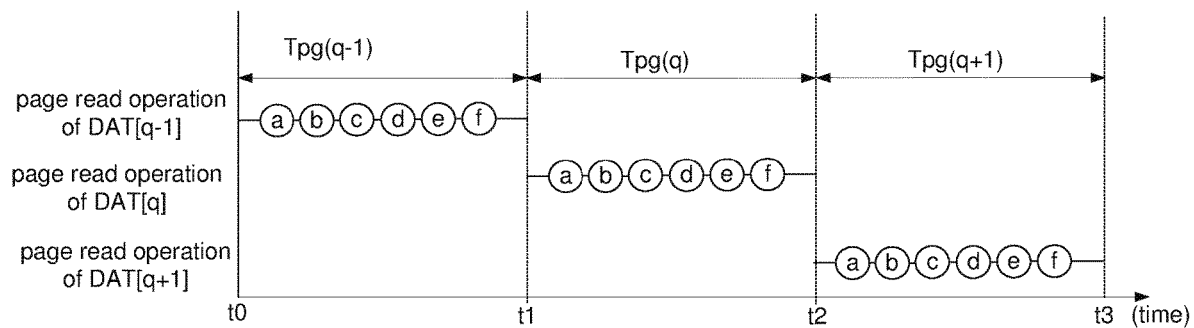
FIG. 1B is a schematic diagram illustrating the page read operations of the conventional NAND flash memory.

FIG. 1B is a schematic diagram illustrating the page read operations of the conventional NAND flash memory. The steps (a) to (f) corresponding to the page read operation of acquiring the page data DAT[q−1] are performed in the duration between the time point t0 and the time point t1. Thus, the duration between the time point t0 and the time point t1 is defined as the page-read duration Tpg(q−1), during which the page address &pg(q−1) is loaded from the host device 11 to the control logic 131 and the page data DAT[q−1] is read from the NAND flash memory 133 to the host device 11.

The steps (a) to (f) corresponding to the page read operation of acquiring the page data DAT[q] are performed in the duration between time point t1 and the time point t2. Thus, the duration between the time point t1 and the time point t2 is defined as the page-read duration Tpg(q), during which the page address &pg(q) is loaded from the host device 11 to the control logic 131 and the page data DAT[q] is read from the NAND flash memory 133 to the host device 11.

The step (a) to step (f) corresponding to the page read operation of acquiring the page data DAT[q+1] are performed in the duration between time point t2 and the time point t3. Thus, the duration between the time point t2 and the time point t3 is defined as the page-read duration Tpg(q+1), during which the page address &pg(q+1) is loaded from the host device 11 to the control logic 131 and the page data DAT[q+1] is read from the NAND flash memory 133 to the host device 11.

As illustrated above, the conventional NAND flash memory can only be read in pages, and transmission procedures of the page address and its corresponding page data are performed in the same page-read duration Tpg. That is, the page address &pg(q−1) and the page data DAT[q−1] are transmitted in the same page-read duration Tpg(q−1), the page address &pg(q) and the page data DAT[q] are transmitted in the same page-read duration Tpg(q), and the page address &pg(q+1) and the page data DAT[q+1] are transmitted in the same page-read duration Tpg(q+1). However, such a mechanism of read operations is inflexible because the sizes of the physical pages are relatively big. Moreover, the host device 11 needs to wait for the latency (the execution time of steps (c), (d), (e)) between issuing the read command rd_cmd to the control logic 131 and receiving the read data from the control logic 131. In consequence, the whole procedure of performing a read operation to the NAND flash memory takes quite a long time in comparison with that of the NOR flash memory.

The typical size of the physical page is, for example, 2 k bytes, which is much greater than a basic access unit of the NOR flash memory. Therefore, there is a need to read the data from the NAND flash memory in smaller access units. To support the smaller access units, the physical pages of the NAND flash memory 133 are equally divided into several portions. In the specification, the terminology "acquisition-unit" is used to represent the divided portions of the physical pages. However, the naming of these divided portions of physical pages may vary. For example, the divided portions can be renamed as subpages, chunks, sectors, and so forth.

Figure 2:
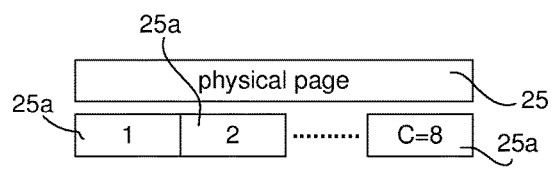
FIG. 2 is a schematic diagram illustrating that the page is divided into acquisition-units.

FIG. 2 is a schematic diagram illustrating that the physical page is divided into acquisition-units. The physical page 25 is divided into C acquisition-units 25a. The symbol "C" represents the default unit number (C). The default unit number is a positive integer, and C is assumed to be 8 in the specification. To specify the data stored at the c-th (c=1~C) acquisition-unit of the page address &pg(q), a coordinate representation "DAT[q,c]" is provided.

In Table 1, the c-th acquisition-unit of the page data DAT[q] stored at the page address &pg(q) is used as examples to explain the symbols and abbreviations used in the specification. The symbol "q" is changed with the page address.

TABLE 1

| meaning | symbols |
| --- | --- |
| page | log |
| page address | &pg(q) |
| page data | DAT[q] |
| (data stored at page address &pg(q)) | |
| data stored at c-th acquisition-unit in page data DAT[q] | DAT[q, c], c = 1~C |
| page-read duration | Tpg |

TABLE 1-continued

| meaning | symbols |
| --- | --- |
| default page-read duration | Tpg_dft |
| page-read duration of page q | Tpg(q) |
| unit-fetching duration | Tu |
| default unit-fetching duration | Tu_dft |
| unit-fetching duration Tu of c-th acquisition-unit in page data DAT[q] | Tu(q, c), c = 1~C |

In order to support the read access in acquisition-units, the page read step is further divided into several sub-steps. For example, in FIG. 3, the page read step is assumed to include 8 sub-steps (f1, f2, . . . f8). The number of sub-steps (f1, f2, . . . f8) is determined by the default unit number (C).

Figure 3:
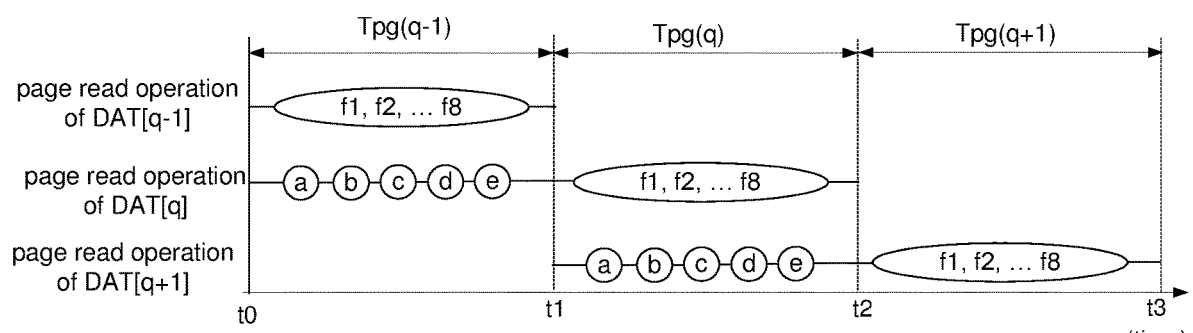
FIG. 3 is a schematic diagram illustrating how a sequence of read operations is performed to the memory device using the read method according to the embodiment of the present disclosure.

FIG. 3 is a schematic diagram illustrating how a sequence of read operations is performed to the memory device using the read method according to the embodiment of the present disclosure. In FIG. 3, it is assumed that the copied page data DAT[q−1] has been shifted from the data register 135 to the cache register 137 by the time point t0.

The step (f) corresponding to the read operation of the page data DAT[q−1] and the steps (a) to (e) corresponding to the read operation of the page data DAT[q] are concurrently executed in the duration between time point t0 and the time point t1. The duration between the time point t0 and the time point t1 is defined as the page-read duration Tpg(q−1), during which the page data DAT[q−1] is acquired.

The step (f) corresponding to the read operation of the page data DAT[q] and the steps (a) to (e) corresponding to the read operation of the page data DAT[q+1] are concurrently executed in the duration between time point t1 and the time point t2. The duration between the time point t1 and the time point t2 is defined as the page-read duration Tpg(q), during which the page data DAT[q] is acquired.

The step (f) corresponding to the read operation of the page data DAT[q+1] is executed in the duration between time point t2 and the time point t3. The duration between the time point t2 and the time point t3 is defined as the page-read duration Tpg(q+1), during which the page data DAT[q+1] is acquired.

Therefore, the read operation of the page data DAT[q] actually involves the page-read durations Tpg(q−1), Tpg(q). In the page-read duration Tpg(q−1), the read command rd_cmd and the page address &pg(q) are received, and the page data DAT[q] has been acquired from the NAND flash memory 133 and is prepared to be ready at the cache register 137. In the page-read duration Tpg(q), the page data DAT[q] is transferred to the host device 11.

Similarly, the read operation of the page data DAT[q+1] actually involves the page durations Tpg(q), Tpg(q+1). In the page-read duration Tpg(q), the read command rd_cmd and the page address &pg(q+1) are received, and the page data DAT[q+1] has been acquired from the NAND flash memory 133 and is prepared ready at the cache register 137. In the page-read duration Tpg(q), the page data DAT[q] is transferred to the host device 11.

Alternatively speaking, based on the embodiment of the present disclosure. The read operation of a selected page is extended to two page-read durations Tpg, that is, a previous page-read duration and a current page-read duration.

In the previous page-read duration, the page address of the selected page is sent to the control logic 131, and the data stored in the selected page is fetched from the NAND flash memory 133 to the cache register 137, through the data register 135. Then, in the current page-read duration, the data stored at the selected page is transferred from the cache register 137 to the host device 11, through the control logic 131.

Moreover, in the current page-read duration, the page address of another selected page is fetched from the NAND flash memory 133 to the cache register 137 so that the page data of the another selected page is ready at the cache register 137 before the next page-read duration starts. In other words, the current page-read duration is related to both the data transmission of the selected page and the address transmission of the another selected page.

In the embedded system, the serial peripheral interface (hereinafter, SPI) is a popular communication interface being used between the host device 11 and the memory device 13. An exemplary waveform showing the read operation of the NAND flash memory 133 based on the SPI protocol is shown.

Figure 4:
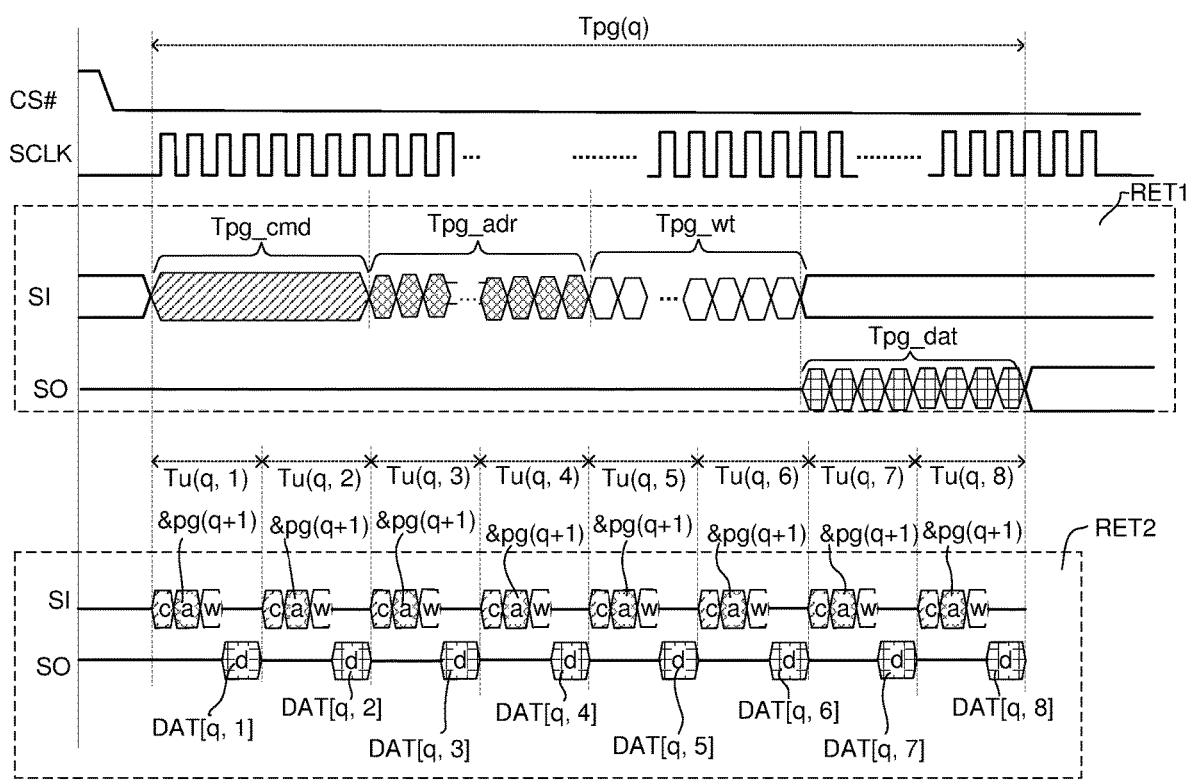
FIG. 4 is a schematic timing diagram illustrating the signals carried by the memory bus between the host device and the memory device when the read operation is executed.

FIG. 4 is a schematic timing diagram illustrating the signals carried by the memory bus between the host device and the memory device when the read operation is executed. In the specification, the physical page is assumed to be divided into 8 acquisition-units. The 8 acquisition-units of data on the same physical page are respectively read in sequence.

The first waveform represents the chip selection signal CS#, and the second waveform represents the system clock SCLK. The chip selection signal CS# is dropped to the low logic level during the page-read duration Tpg(q). Two dotted rectangles RET1, RET2 are shown to represent different implementations of reacting the read command rd_cmd. In short, the waveforms in the dotted rectangle RET1 represent a conventional page read operation, and the waveforms in the dotted rectangle RET2 represent the page read operation according to the embodiment of the present disclosure being capable of separating data stored at different acquisition-units in the same physical page.

The dotted rectangle RET1 circulates the third and the fourth waveforms, respectively representing the serial input signal SI and the serial output signal SO of the memory device 13. Being issued by the host device 11, the serial input signal SI is transmitted to the memory device 13. On the other hand, the serial output signal SO is issued by the control logic 131. The waveforms shown in dotted rectangle RET1 represent steps corresponding to the read operation of the page data DAT[q] between the time point t1 and the time point t2 in FIG. 1B.

The page-read duration Tpg(q) starts with command cycles Tpg_cmd, followed by the address cycles Tpg_adr, then the waiting cycles Tpg_wt, and the data cycles Tpg_dat. The read command rd_cmd is transmitted during the command cycles Tpg_cmd. The page address to be loaded is transmitted during the address cycles Tpg_adr. The number of the address cycles is related to the number of I/Os that the memory device 13 has. The waiting cycles Tpg_wt are optional, and the number of waiting cycles is related to the speed of the system clock. The higher the frequency that the system clock has, the more cycles are included by the waiting cycles. The page data to be read are transmitted during the data cycles Tpg_dat.

The dotted rectangle RET2 circulates the fifth and the sixth waveforms, respectively represent the serial input signal SI and the serial output signal SO of the NAND flash memory 133, which can be accessed in acquisition-units. The waveforms shown in dotted rectangle RET2 are corresponding to steps corresponding to the read operation of the page data DAT[q], DAT[q+1] between the time point t1 and the time point t2 in FIG. 3.

Each of the unit-fetching durations Tu(q, 1), Tu(q, 2), . . . Tu(q, 8) starts with command cycles Tpg_cmd, followed by the address cycles Tpg_adr, then the waiting cycles Tpg_wt, and the data cycles Tpg_dat. In the figures, different alphabets and screentone are used to represent types of the cycles in the unit-fetching duration. The diagonal screentone and the letter "c" jointly represent the command cycles Tpg_cmd, the diamond mesh and the letter "a" jointly represent the address cycles Tpg_adr, the blank and the letter "w" jointly represent the waiting cycles Tpg_wrt, and the lattice screentone and the letter "d" jointly represent the data cycles Tpg_dat.

The constitutions of the unit-fetching durations Tu(q, 1), Tu(q, 2)~Tu(q, 8) in the dotted rectangle RET2 are similar to the constitution of the page-read duration Tpg(q) in the dotted rectangle RET1. That is, the sequence of the command cycles, the address cycles, the waiting cycles, and the data cycles in the unit-fetching durations Tu(q, 1), Tu(q, 2), . . . Tu(q, 8) and the page-read duration Tpg(q) are the same. Therefore, the host device 11 can still issue the request of the page read in a compatible approach.

The comparison of the read operations in the dotted rectangles RET1, RET2 are summarized in Table 2. In practical application, the memory device 13 may support either the page read mode (dotted rectangle RET1), the unit fetching mode (dotted rectangle RET2), or both (dotted rectangle RET1 and dotted rectangle RET2).

TABLE 2

| | Address to be loaded | Data to be read |
|---|---|---|
| page read mode (dotted rectangle RET1) | &(q) | DAT[q] |
| unit fetching mode (dotted rectangle RET2) | &pg(q) | DAT[q + 1] |

Figure 5:
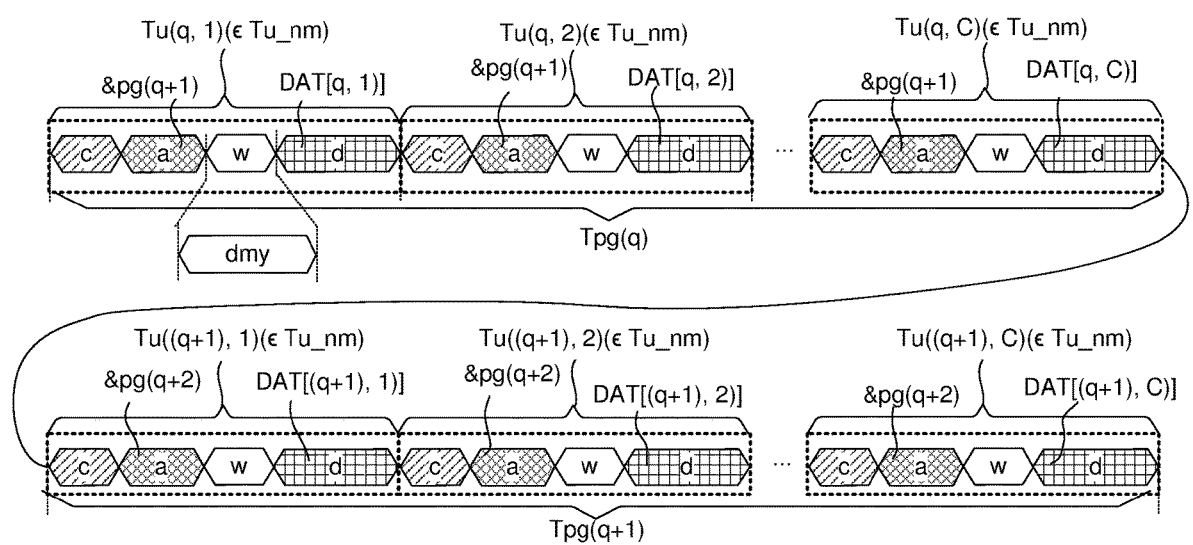
FIG. 5 is a schematic diagram illustrating that the sequence representing that page data of two consecutive page addresses are read based on the read method according to the embodiment of the present disclosure.

FIG. 5 is a schematic diagram illustrating that the sequence representing that page data of two consecutive page addresses are read based on the read method according to the embodiment of the present disclosure. As illustrated above, the page data DAT[q], DAT[q+1] are read in acquisition-units Tu(q, 1)~Tu(q, C), Tu((q+1), 1)~Tu((q+1), C), and each of the unit-fetching duration includes some command cycles (c), some address cycles (a), some waiting cycles (w), and some data cycles (d).

In the page-read duration Tpg(q), acquisition-units of the page data DAT[q] are respectively read in C unit-fetching durations Tu(q, 1)~Tu(q, C). Meanwhile, the page address &pg(q+1) is loaded from the host device 11 to the control logic 131. In the page-read duration Tpg(q+1), data stored at the C acquisition-units of the page data DAT[q+1] are respectively read in C unit-fetching durations Tu((q+1), 1)~Tu((q+1), C). Meanwhile, the page address of the page to be read is loaded from host device 11 to the control logic 131. The page to be read can be a consecutive page, for example, the page address &pg(q+2) or a page located at the inconsecutive address.

Comparing with the NOR flash memory, the overall speed of NAND flash is more efficient if there is an enormous amount of data that needs to be continuously read. There are at least two types of such applications, that is, the code loading and the DMA operation.

For the code loading operation, the programs stored in the flash memory need to be copied to the host memory (SRAM or DRAM) space. Alternatively speaking, the code loading operations include continuously read data being stored at a certain space of the flash memory to the host memory. The code loading operation is performed when the system (including the host device 11 and the memory device 13) is power on. Once the system is power on, the program stored at a default initial address &pg(default) starts to be copied to the host memory. An example of the program code loading is shown in FIGS. 6A and 6B.

For the DMA operation, the page addresses and length of the data to be acquired are known by the host device 11 in advance, regardless of whether the storage locations of the data are consecutive or inconsecutive. As the information about the locations of the data to be read is known in advance, the above-mentioned read operation can be applied. A block diagram of the electronic device performing the DMA operation is shown in FIG. 7.

FIG. 6A is a schematic diagram illustrating that the memory device 13 reads data from inconsecutive page addresses. Some arrows are shown on the left side of the memory mapping. The arrows with straight lines represent that the page addresses are consecutive, and the arrow with the curve represents that the page addresses are inconsecutive. Therefore, the page addresses &pg(0)~&pg(L) are consecutive, the page addresses &pg(L) and &pg(M) are inconsecutive, and the page addresses &pg(M)~&pg(M+1) are consecutive.

FIG. 6B is a flow diagram illustrating the operation sequence that the memory device 13 reads data from the data allocation shown in FIG. 6A. Please refer to FIGS. 6A and 6B together.

Firstly, the default initial page address &pg(default) (for example, 0x00) is loaded as soon as the memory device 13 is power on (step S3a). Therefore, by the time the host device 11 starts to issue the read command rd_cmd, the page data DAT[default] has been prepared ready at the cache register 137 in the background. The page address &pg(0x00) is merely an example of a default initial page address.

In a case that the default initial page address &pg(default) is not defined, a page-read duration needs to be utilized to transfer the page address &pg(initial_page) prior to acquire the page data DAT[initial_page]. Therefore, the host device 11 needs to wait for a page-read duration before the page data DAT[initial_page] is available. In other words, the data that the host device 11 receives at the first page-read duration is not correct if the default initial page address &pg(default) is not specified.

Then, the page data DAT[default] is transferred to the host device 11 and the page address &pg(1), which is included in a full address, is received from the host device 11 and extracted by the control logic 131 during the same page-read duration Tpg (step S3b).

Later, the page data DAT[1] is read, and the page address &pg(2) is loaded during the same page-read duration Tpg (step S3c). Similar operations are repetitively executed until the page data DAT[L−1] is read, and the page address &pg(L) is loaded during the same page-read duration Tpg (step S3d).

Although the page address &pg(L) and the page address &pg(M) are inconsecutive, the control logic 131 can still receive and extract the page address &pg(M) from the host device 11 in advance. Thus, the page data DAT[L] is read, and the page address &pg(M) is loaded during the same page-read duration Tpg (step S3e). Moreover, the page data DAT[M] is read, and the page address &pg(M+1) is loaded during the same page-read duration Tpg (step S3f). As illustrated in FIGS. 6A and 6B, the read operations based on the embodiment of the present disclosure can be continuously read, regardless of whether the storage locations of the read data are consecutive or not.

FIG. 7 is a schematic diagram illustrating that a DMA operation is performed between the host device and the memory device. The host device 11 includes an internal bus, a host controller 111, a host memory 113, a DMA engine 115, and a flash interface circuit 117. The internal bus is utilized to transmit commands and data between the host controller 111, the host memory 113, the DMA engine 115, and the flash interface circuit 117. The control logic 131 is electrically connected to the host device 11, the data register 135, the cache register 137, and the NAND flash memory 133.

The host controller 111 provides data storage information, such as locations and length of the data to be transferred, to the control logic 131. The data storage information is passed through the DMA engine 115 and the flash interface circuit 117, as the dotted arrow P1 shows. The dotted arrow P2 represents the path related to how the acquired DMA data are transferred from the memory device 13 to the host device 11. Once being copied to the host memory 113, the DMA data can be accessed by the host controller 111 through the internal bus.

The memory mapping and the reading flow of the DMA operations are similar to the program code loading application except that the initial address is not known by default. As memory mapping and execution flow similar to FIGS. 6A and 6B for the DMA operation, memory mapping and the execution flow of the DMA operation are not described to omit redundancy.

The common part of both the code loading application and the DMA operation application is that the amount of read data is large, and the page address of the read data is known in advance. As long as the locations of the data are known by the host controller 111, the read data can be correctly acquired by the host device 11, regardless of whether the read data are stored in the consecutive or the inconsecutive page addresses.

Figure 8:
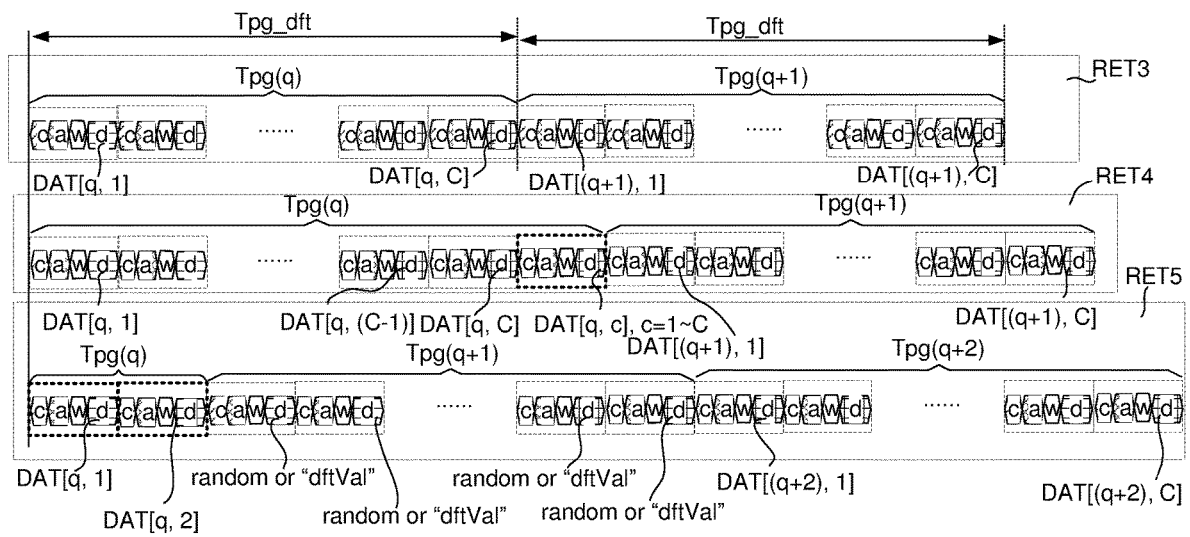
FIG. 8 is a schematic diagram illustrating scenarios when the number of acquisition-units included in the pages are different.

FIG. 8 is a schematic diagram illustrating scenarios when the number of acquisition-units included in the pages is different. Although, by default, the page-read duration is assumed to be equivalent to 8 unit-fetching durations (Tpg_dft=Tc*8), the length of the data to be acquired by the host device 11 is not equivalent to multiple of 8 acquisition-units. In consequence, the actual number of the acquisition-units to be read in the page-read duration may not be equivalent to "8". The dotted rectangles RET3, RET4, RET5 shown in FIG. 8 represent the page-read durations Tpg(q) having 8 unit-fetching durations, 9 unit-fetching durations, and 2 unit-fetching durations, respectively.

The two continuous page read operations of page data DAT[q], DAT[q+1] shown in dotted rectangle RET3 are explained. The lengths of the page-read durations Tpg(q), Tpg(q+1) in the dotted rectangle RET3 are equivalent to the default page-read duration Tpg_dft. During the page-read duration Tpg(q), the data stored at the 8 acquisition-units of the current page data DAT[q] are respectively read in 8 unit-fetching durations, and the next page address &(q+1) is loaded. During the page-read duration Tpg(q+1), the data DAT[q, 1]~DAT[q, C], which are stored at the 8 acquisition-units of the current page data DAT[q+1], are respectively read in 8 unit-fetching durations, and the next page address &pg(q+2) is loaded.

The two continuous page read operations of page data DAT[q], DAT[q+1] shown in dotted rectangle RET4 are now explained. The page-read duration Tpg(q) is assumed to include 9 unit-fetching durations, which is longer than the default page-read duration Tpg_dft. Whereas, length of the page-read duration Tpg(q+1) is equivalent to length of the default page-read duration Tpg_dft.

During the first 8 unit-fetching durations of the page-read duration Tpg(q), the data DAT[q, 1]~DAT[q, C] stored at the 8 acquisition-units of the current page data DAT[q] are respectively read. Before the 9-th unit-fetching duration starts, all the data DAT[q, 1]~DAT[q, C] stored at the 8 acquisition-units of the current page data DAT[q] have been read. Therefore, during the 9-th unit-fetching duration, any of the data stored at the 8 acquisition-units in the page data DAT[q] can be repeatedly selected and transferred (DAT[q, c] wherein c=1~C). Please note that the 8 acquisition-units stored in the same page data DAT[q] can be transferred in sequence or random order. In addition, during the page-read duration Tpg(q), the next page address &pg(q+1) is loaded from the host device 11 to the control logic 131. During the page-read duration Tpg(q+1), the current page data DAT[q+1] is respectively read in 8 unit-fetching durations, and the next page address &pg(q+2) is loaded from the host device 11 to the control logic 131.

The three continuous page read operations of page data DAT[q], DAT[q+1], DAT[q+2] shown in dotted rectangle RET5 are explained. The page-read duration Tpg(q) in the dotted rectangle RET5 is assumed to include only 2 unit-fetching durations. Apparently, the page-read duration Tpg(q) is much shorter than the default page-read duration Tpg_dft. Relatively, the page-read durations Tpg(q+1), Tpg(q+2) are equivalent to the default page-read duration Tpg_dft.

During the page-read duration Tpg(q), the current page data DAT[q] is read. However, the storage space of the current page address &pg(q) is not fully utilized. Instead, only two acquisition-units of data are actually read out from the page address &pg(q). In other words, 6 out of the 8 acquisition-units are not read out from the page address &pg(q). This may happen as the amount of read data may not be equivalent to multiple pages. Similarly, the next page address &pg(q+1) is transferred from the host device 11 to the control logic 131 during the page-read duration Tpg(q).

However, as the page-read duration Tpg(q) is much shorter than the default page-read duration Tpg_dft, transmission of the next page address &pg(q+1) is not complete by the end of the page-read duration Tpg(q). Consequentially, the control logic 131 is incapable of knowing where to acquire the page data DAT[q+1]. Therefore, when the page-read duration Tpg(q+1) starts, the current page data DAT[q+1] is not ready at the cache register 137, and the control logic 131 is incapable of correctly transferring the current page data DAT[q+1] to the host device 11.

During the page-read duration Tpg(q+1), the page address &pg(q+2) is loaded from the host device 11 to the control logic 131, but the page data DAT[q+1] is not correctly/completely stored/buffered at the cache register 137. Under such circumstances, the control logic 131 may transfer a default value dftVal (for example, dftVal=0x55) to notify the host device 11 that the read data is "unknown." Alternatively, the control logic 131 may transfer an unexpected (random) value from the cache register 137. The default value dftVal can be configurable.

During the page-read duration Tpg(q+2), the page address &pg(q+3) is loaded, and the page data DAT[q+2] is correctly transmitted from the cache register 137 to the host device 11.

The above-mentioned examples are mainly related to changes in the operations of the memory device 13. In some applications, the communication protocols between the control logic 131 and the host controller 111 may be further modified to accelerate the read operation. According to the embodiment of the present disclosure, it is possible to use one or some of the waiting cycles to create special protocols between the host controller 111 and the control logic 131.

Figure 9A:
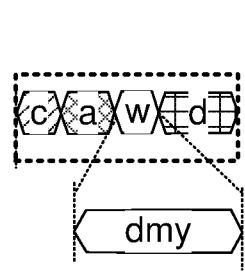
FIGS. 9A and 9B are schematic diagrams illustrating the unit-fetching durations having different types of waiting cycles.
Figure 9B:
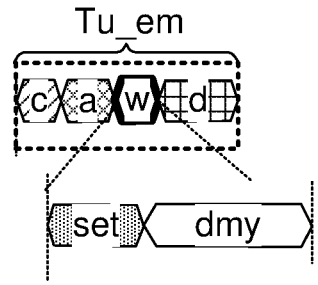

FIGS. 9A and 9B are schematic diagrams illustrating the unit-fetching durations having different types of waiting cycles (w). In FIG. 9A, the waiting cycles (w) include only dummy cycles (dmy), which are not used or any specific function. Majority of the unit-fetching durations in the normal unit-fetching mode have similar constructions shown in FIG. 9A.

In FIG. 9B, the waiting cycles (w) include some setting cycles (set) and some dummy cycles (dmy). The setting cycles (set) are used to represent that the host device intends to enter and/or to exit an enhanced unit-fetching mode. It is possible to define different types of enhanced unit-fetching modes by assigning different setting values carried in the setting cycles (set). Some of the unit-fetching durations in the normal unit-fetching mode and some of the unit-fetching duration in the enhanced unit-fetching mode have similar constructions show in FIG. 9B. The unit-fetching durations having similar construction in FIG. 9B can be represented as T_set.

Figure 10:
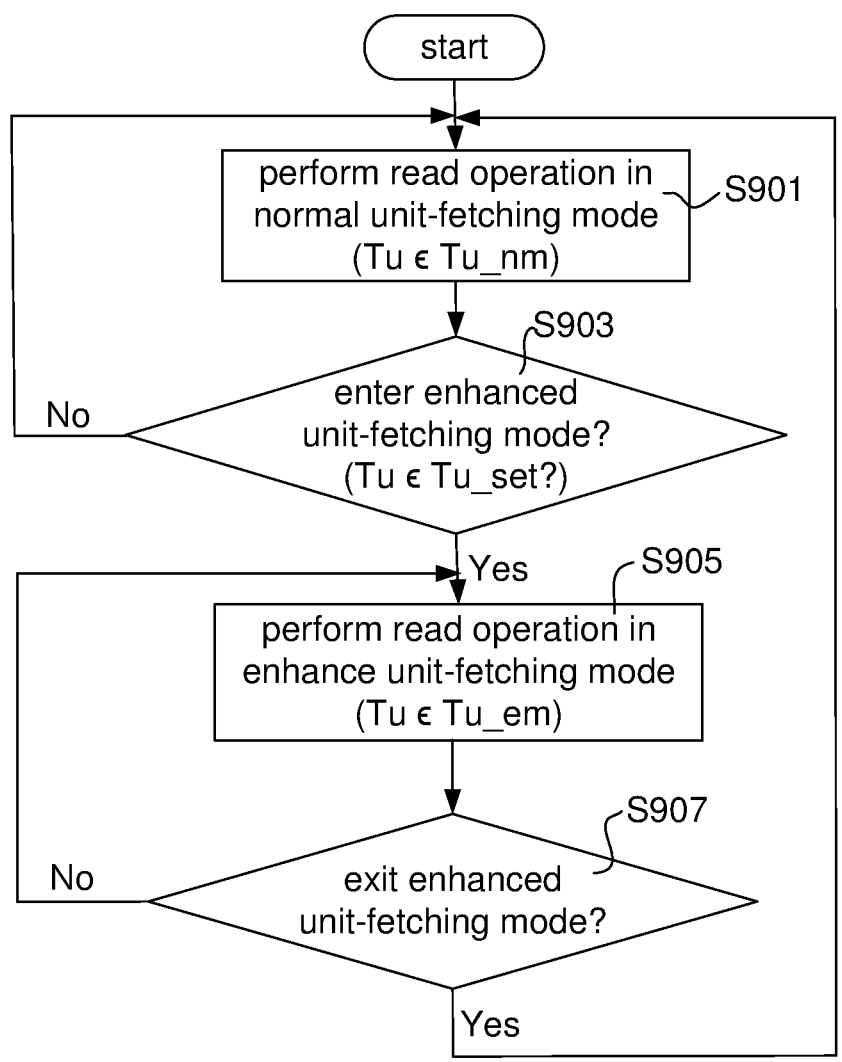
FIG. 10 is a flow diagram illustrating that the read operation can be switched in between different mode with respect to types of the waiting cycles.

FIG. 10 is a flow diagram illustrating that the read operation can be switched in between different modes with respect to types of waiting cycles. Firstly, the read operation is performed in the normal unit-fetching mode, and the unit-fetching duration in the normal unit-fetching mode is represented as Tu_nm (step S901). The control logic 131 checks the beginning cycle(s) of the waiting cycles to identify whether the enhanced unit-fetching mode should start (step S903). If there are no setting cycles in the waiting cycles, step S901 is repetitively performed. If the determination result of step S903 is positive, the read operation exits the normal unit-fetching mode, and the read operation starts to be performed in the enhanced unit-fetching mode (step S905). The unit-fetching duration in the enhanced unit-fetching mode is represented as Tu_em. In the enhanced unit-fetching mode, the host device 11 and the control logic 131 communicate with each other according to the predefined protocol(s). In the predefined protocol(s), some of the cycles in the unit-fetching duration can be omitted to accelerate the read operation. Later, the control logic 131 checks if the enhanced unit-fetching mode should terminate (step S907). If the determination result of step S907 is negative, the read operation remains in the enhanced unit-fetching mode, and step S905 is repetitively executed. Otherwise, the read operation exits the enhanced unit-fetching mode, and step S901 is executed again.

In practical applications, the predefined protocol(s) being adapted in the enhanced unit-fetching mode may vary. FIGS. 11, 12, 13, 14A, and 14B are exemplary predefined protocols that can be adapted in the enhanced unit-fetching mode to accelerate the read operations.

Figure 11:
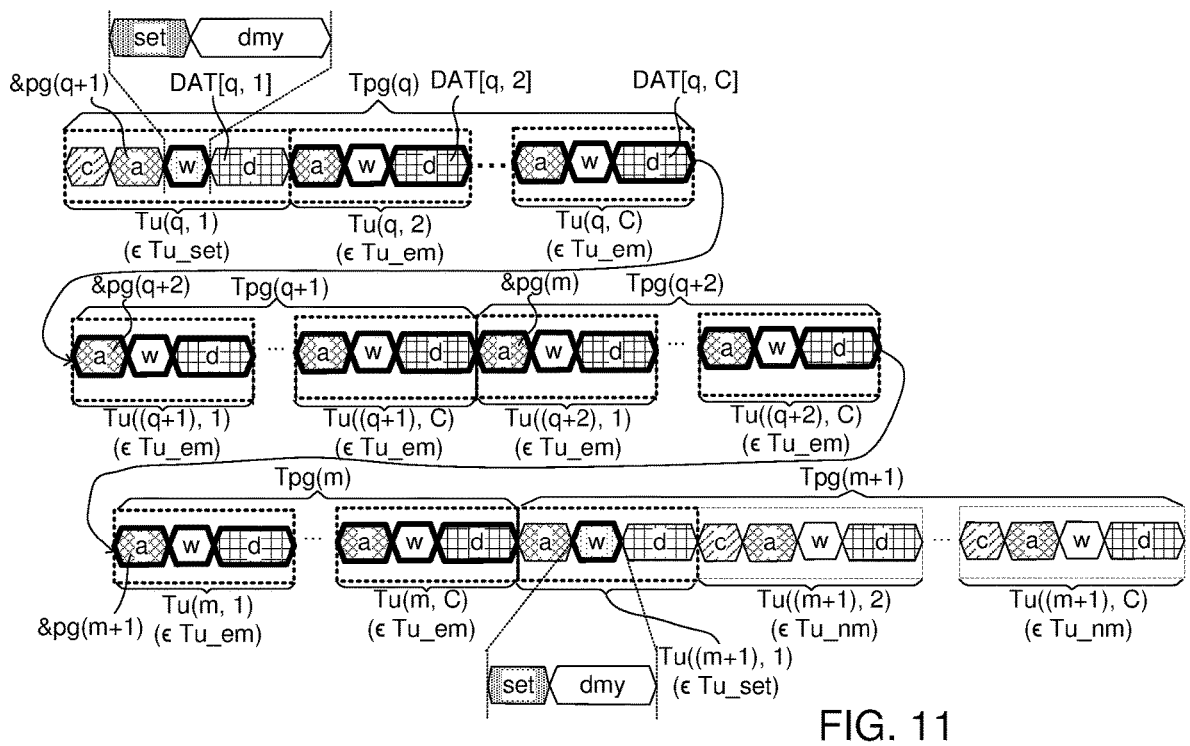
FIG. 11 is a schematic diagram illustrating an example of the read operation in the enhanced unit-fetching mode during which the command cycles are omitted.

FIG. 11 is a schematic diagram illustrating an example of the read operation in the enhanced unit-fetching mode during which the command cycles are omitted. The page-read duration Tpg(q), Tpg(q+1), Tpg(q+2), Tpg(m), Tpg(m+1) are shown. In FIG. 11, it is assumed that the page addresses &pg(q), &pg(q+1), &pg(q+2) are consecutive, the page addresses &pg(m), &pg(m+1) are consecutive, and the page addresses &pg(q+2), &pg(m) are inconsecutive.

Each of the page-read durations Tpg(q), Tpg(q+1), Tpg (q+2), Tpg(m), Tpg(m+1) includes C unit-fetching durations. For example, the page-read duration Tpg(q) includes the unit-fetching durations Tu(q, 1), Tu(q, 2) . . . . Tu(q, C). The constitutions of the page-read durations Tpg(q+1), Tpg(q+2), Tpg(m), Tpg(m+1) are similar and the details are omitted.

In the page-read duration Tpg(q), the waiting cycles in the unit-fetching duration Tu(q, 1) include the setting cycles (set) and the dummy cycles (dmy). According to the setting cycles of the unit-fetching duration Tu(q, 1), the control logic 131 realizes that the host device 11 will initiate the enhanced unit-fetching mode.

In the duration starting from the unit-fetching duration Tu(q, 2) in the page-read duration Tpg(q) to the last unit-fetching duration Tu(m, C) of the page-read duration Tpg(m), the host device 11 stops transmitting the read command rd_cmd to the control logic 131. The address cycles, the waiting cycles, and the data cycles of the unit-fetching durations in the enhanced unit-fetching mode are shown in bold lines. As the read command rd_cmd is not repetitively transmitted in the unit-fetching durations in the enhanced unit-fetching mode, the length of the unit-fetching duration can be shorter, and the read operation can be performed faster.

In the page-read duration Tpg(m+1), the waiting cycles in the unit-fetching duration Tu(m+1, 1) include the setting cycles (set) and the dummy cycles (dmy). According to the setting cycles of the unit-fetching duration Tu(m+1, 1), the control logic 131 realizes that the host device 11 will stop the enhanced unit-fetching mode. Therefore, by the end of the unit-fetching duration Tu(m+1, 1), the read operation returns to the normal unit-fetching mode. The unit-fetching durations Tu(m+1, 2)~Tu(m+1, C) include the command cycles, together with the address cycles, the waiting cycles, and the data cycles.

While performing the read operation to pages pg(q+1), pg(q+2), pg(m) in the enhanced unit-fetching mode, the page addresses &pg(q+1), &pg(q+2), &Tpg(m) are respectively received in page-read durations Tpg(q), Tpg(q+1), Tpg(q+2), that is, the page-read durations which are prior to the page-read duration when the page data DAT[q+1], DAT[q+2], DAT[m] are actually received. Thus, according to FIG. 11, the control logic 131 may perform the read operation to pages located at consecutive and/or inconsecutive addresses in the enhanced unit-fetching mode.

The protocols defined and used between the host device 11 and the control logic 131 are not limited. In some applications, the information being carried by the waiting cycles may be unitized to inform the control logic 131 about the length (duration) of the enhanced unit-fetching mode. For example, the setting cycles may carry a specific setting code to represent that the read data having a predefined size should be read in the upcoming durations in the enhanced unit-fetching mode. The predefined size is multiple of pages. Once the predefined size of data has been read, the read operation between the host device 11 and the control logic 131 automatically returns to the normal unit-fetching mode.

Figure 12:
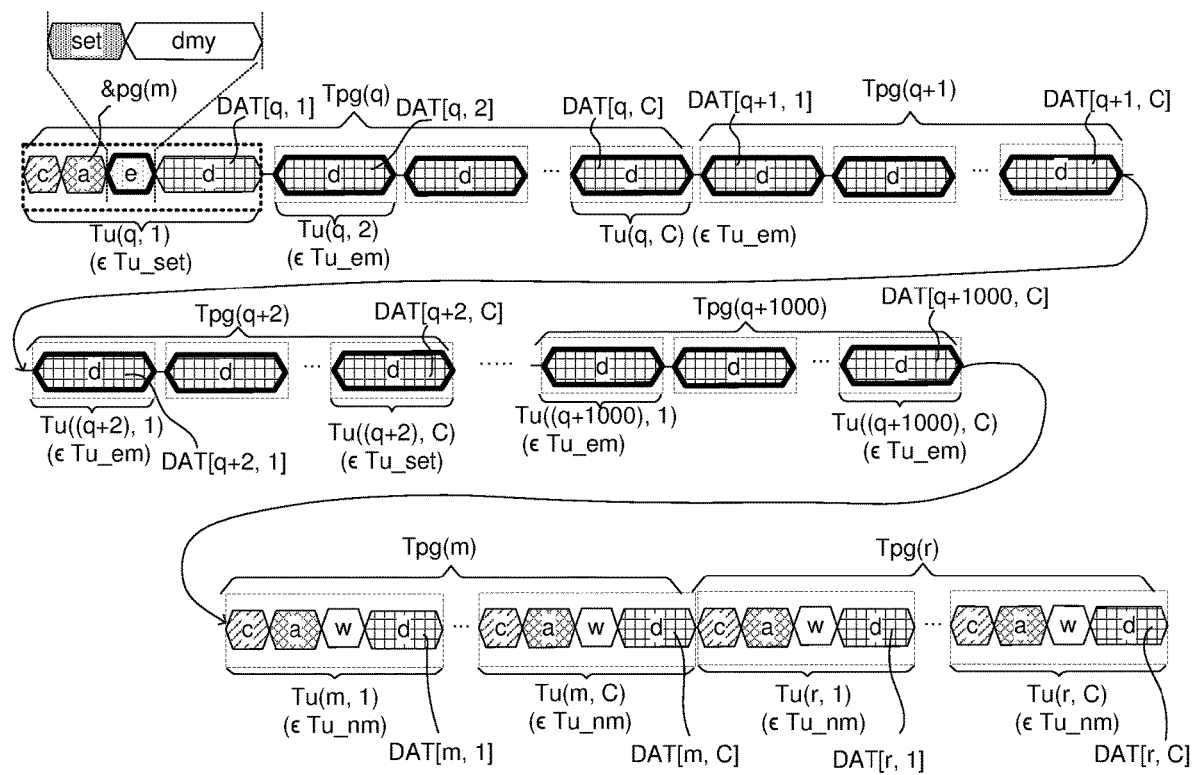
FIG. 12 is a schematic diagram illustrating that a predefined size of data to be continuously read in the enhanced unit-fetching mode.

FIG. 12 is a schematic diagram illustrating that a predefined size of data to be continuously read in the enhanced unit-fetching mode. The page-read duration Tpg(q), Tpg(q+1), Tpg(q+2), Tpg(q+1000), Tpg(m), Tpg(R) are shown. In FIG. 12, it is assumed that the predefined size is 1,000 pages, the page addresses &pg(q)~&pg(q+1000) are consecutive, and the page addresses &pg(q+1000), &pg(m), Tpg(r) are inconsecutive.

In the page-read duration Tpg(q), only the unit-fetching duration Tu(q, 1) includes the waiting cycles, which include the setting cycles (set) and the dummy cycles (dmy). The other unit-fetching curations Tu(q, 2)~Tu(q, C) include only the data cycles. According to the setting cycles of the unit-fetching duration Tu(q, 1), a specific setting code representing the predefined size (number of consecutive pages) of data to be read continuously can be defined. By reading the specific setting code, the control logic 131 realizes that the enhanced unit-fetching mode will last for a duration last for 1,000 page-read durations.

Once data of the predefined size of data (data stored at page addresses &q to &(q+1000)) have been read, the read operation automatically exits the enhanced unit-fetching mode and enters the normal unit-fetching mode. As shown in FIG. 12, after data of page (q+1000) are read completely, the page-read duration Tpg(m) starts. In the page-read duration Tpg(m), the host device 11 transmits the read command rd_cmd, the page address, and the waiting cycles to the control logic 131, and the control logic 131 provides the read data to the host device 11.

As the control logic 131 does not transfer the page addresses during the enhanced unit-fetching mode, the page address to be read after the page-read duration Tpg(q+1000) needs to be transferred to the control logic 131 prior to the beginning of the enhanced unit-fetching mode. As shown in FIG. 12, the page address &pg(m) is transferred in the address cycles of the page-read duration Tpg(q). Thus, after finish reading data stored at the page address &pg(q+1000), the control logic 131 is capable of continuously acquiring data from page pg(m), without interrupting the page read operation.

On the other hand, if the address cycles of page-read duration Tpg(q) do not carry the page address &pg(m) in its address cycles, the control logic 131 is incapable of continuously acquiring data from the page address &pg(m). Under such circumstances, the data received during the page-read duration soon after the end of the enhanced unit-fetching mode should be ignored.

In FIG. 12, the control logic 131 starts to perform the page read operation in the normal unit-fetching mode. In the address cycles of the page-read duration Tpg(m), the page address &pg(r) is transmitted. As illustrated above, the page addresses &pg(m), &pg(r) to be read during the normal unit-fetching mode can be consecutive or inconsecutive. In the data cycles of the page-read duration Tpg(m), the page data of the pg(m) may or may not be successfully read, depending on whether the page address &pg(m) is transmitted during address cycles of the page-read duration Tpg(q).

In some applications, the predefined size is a fixed value. The fixed value is predefined and known by the host device 11 and the control logic 131 in advance. Whenever the read operation enters the enhanced unit-fetching mode, the control logic 131 continuously reads a certain amount of data, as specified by the fixed value, each time. An example of the fixed value representing that page data is read in the enhanced unit-fetching mode is shown in FIG. 13.

Figure 13:
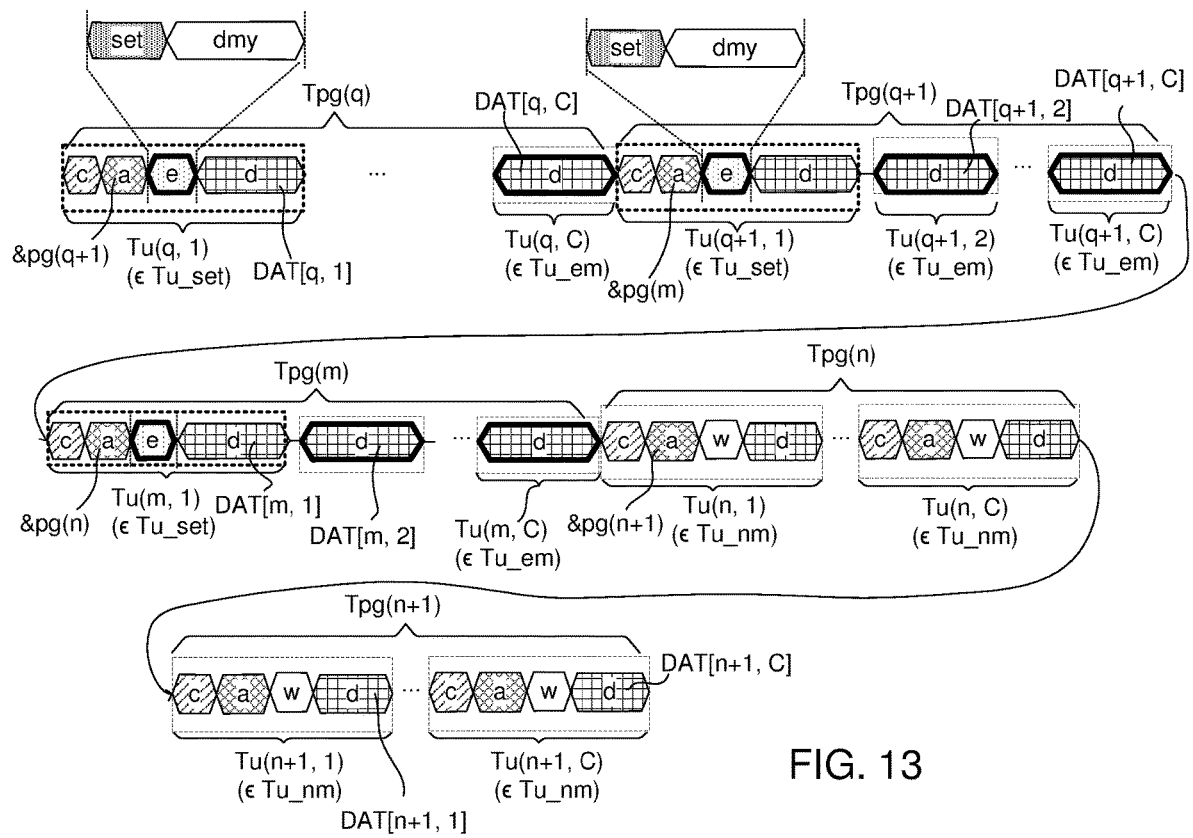
FIG. 13 is a schematic diagram illustrating that the data stored at the same page are continuously read in the enhanced unit-fetching mode.

FIG. 13 is a schematic diagram illustrating that data stored at the same page are continuously read in the enhanced unit-fetching mode. The page-read durations Tpg(q), Tpg(q+1), Tpg(m), Tpg(n), Tpg(n+1) are shown. In FIG. 13, it is assumed that the page addresses &pg(q), &pg(q+1) and page address &pg(n), &pg(n+1) are consecutive, and the page addresses &pg(q+1), &pg(m), &pg(n) are inconsecutive. The page-read durations in FIG. 13 are briefly illustrated.

The address cycles (a) in the page-read duration Tpg(q) indicate that which of the page should be read in the next page-read duration. Similarly, the address cycles (a) in the page-read durations Tpg(q+1), Tpg(m), Tpg(n), respectively indicate which of the pages should be read in the page-read durations Tpg(m), Tpg(n), Tpg(n+1).

The waiting cycles in the page-read durations Tpg(q), Tpg(q+1), Tpg(q) include some setting cycles (set) and some dummy cycles (dmy). The setting cycles in the page-read duration Tpg(q) indicate that the data to be read in the data cycles in the same page-read duration Tpg(q) are transferred in the enhanced unit-fetching mode, and there is no command cycles, addresses cycles, nor waiting cycles in the following unit-fetching durations Tu(q, 2)~Tu(q, C). Alternatively speaking, in the page-read duration Tpg(q), only the unit-fetching duration Tu(q, 1) includes the command cycles, the address cycles (a), the waiting cycles, and the data cycles. The address cycles (a) in the page-read duration Tpg(q) indicate the address of the data to be read in the next page-read duration, that is, the page-read duration Tpg(q+1).

Similarly, in the page-read duration Tpg(q+1), only the unit-fetching duration Tu(q+1, 1) includes the command cycles (c), the address cycles (a), the waiting cycles (w), and the data cycles (d), while the other unit-fetching durations Tu(q+1, 2)~Tu(q+1, C) include only the data cycles (d). As the address cycles (a) in the page-read duration Tpg(q+1) indicate that the data stored at the page address &pg(m) will be read in the next page-read duration, that is, the page-read duration Tpg(m), the next page address to be read (&pg(m)) and the current page address being read (&pg(q+1)) can be inconsecutive in the enhanced unit-fetching mode.

In the page-read duration Tpg(m), only the unit-fetching duration Tu(m, 1) includes the command cycles (c), the address cycles (a), the waiting cycles (w), and the data cycles (d), while each of the unit-fetching durations Tu(m, 2)~Tu(m, C) includes only the data cycles (d). The address cycles (a) in the page-read duration Tpg(m) indicate that the data stored at the page address &pg(n) will be read in the next page-read duration, that is, the page-read duration Tpg(n).

Please note that, as the read operation being performed in the enhanced unit-fetching mode read data in pages, the control logic 131 can easily transit between the enhanced unit-fetching mode and the normal unit-fetching mode according to FIG. 13. The waiting cycles in the page-read duration Tpg(n), Tpg(n+1) include only dummy cycles (dmy). Therefore, the read operation exits the enhanced unit-fetching mode since the page-read duration Tpg(m). In the page-read durations Tpg(n), Tpg(n+1), all the unit-fetching durations Tu(n, 1)~Tu(n, C) include the command cycles (c), the address cycles (a), the waiting cycles (w), and the data cycles (d).

As shown in FIG. 13, lengths of the page-read durations Tpg(q), Tpg(q+1), Tpg(m) in the enhanced unit-fetching mode are shorter than lengths of the page-read duration Tpg(n), Tpg(n+1) in the normal unit-fetching mode because the command cycles, the address cycles (a) and the waiting cycles in the (C−1) unit-fetching durations are eliminated. Therefore, the per-page read operation, as provided in FIG. 13, can accelerate the read operation.

In FIGS. 11, 12, and 13, the control logic 131 is informed by the setting cycles about when the enhanced unit-fetching mode starts/ends. In some applications, a hardware signal (for example, the chip selection signal CS#) can be referred to by the control logic 131 to signify the transition between the normal unit-fetching mode and the enhanced unit-fetching mode.

Figure 14A:
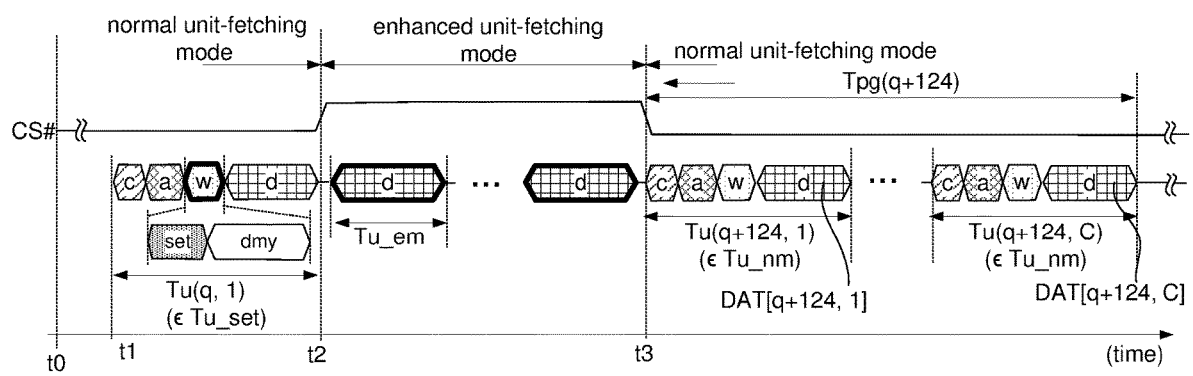
FIG. 14A is a schematic diagram illustrating that changes in the logic level of the chip selection signal CS# can be temporarily suspended during the enhanced unit-fetching mode.

FIG. 14A is a schematic diagram illustrating that changes in the logic level of the chip selection signal CS# can be temporarily suspended during the enhanced unit-fetching mode. In addition to changes in the patterns of the serial input signals and the serial output signals, the chip selection signals CS# can be modified with respect to the enhanced unit-fetching mode. In FIG. 14A, the chip selection signal CS# is raised to the high logic level when the read operation enters the enhanced unit-fetching mode.

In the specification, the page, whose data is read by the control logic 131 by the time point that the chip selection signal CS# transits from the high logic level to the low logic level, can be defined as a last enhanced read page. Once the enhanced unit-fetching mode terminates and the last enhanced read page operation in the enhanced unit-fetching mode completes, the page having an address next to the last enhanced read page is read during the normal unit-fetching mode immediately after the enhanced unit-fetching mode. In FIG. 14A, the last enhanced read page is assumed to be page (q+123).

Some unit-fetching durations Tu(q, 1), Tu(q+124, 1), Tu(q+124, C) are shown in FIG. 14A. The unit-fetching duration Tu(q, 1) is corresponding to the duration during which the data stored at the page address &pg(q) are read. The symbol Tpg(q+124) represents the page-read duration during which the control logic 131 is incapable of correctly reading page data as the page address is not received in advance. The unit-fetching durations Tu(q+124, 1), Tu(q+124, C) represent the unit-fetching durations included in the page-read duration Tpg(q+124).

The waiting cycles in the unit-fetching duration Tu(q, 1) include setting cycles (set) and dummy cycles (dmy). According to the setting cycles of the unit-fetching duration Tu(q, 1), the control logic 131 is aware that the enhanced unit-fetching mode will start soon after the unit-fetching duration Tu(q, 1). In other words, the unit-fetching duration between the time point t1 and the time point t2 is utilized to inform the control logic 131 that the enhanced unit-fetching mode will start. After time point t2, the chip selection signal CS# is raised to the high logic level. Meanwhile, the control logic 131 can perform the read operation to consecutive pages in acquisition-units. In the embodiment, the read operation is continuously performed in the enhanced unit-fetching mode as long as the chip selection signal CS# remains at the high logic level.

At the time point t3, the chip selection signal CS# is dropped to the low logic level to inform the control logic 131 that the enhanced unit-fetching mode should terminate. Thus, the control logic 131 executes the read operation in the normal unit-fetching mode after time point t3. In the first page-read duration Tpg immediately after the chip selection signal CS# transits from the high logic level to the low logic level, data stored at the page address, which is consecutive to the last page address during the enhanced unit-fetching mode, is read. For example, the page data DAT[q+124] are read. Thus, the unit-fetching durations are represented as Tu(q+124, 1)~Tu(q+124, C).

Figure 14B:
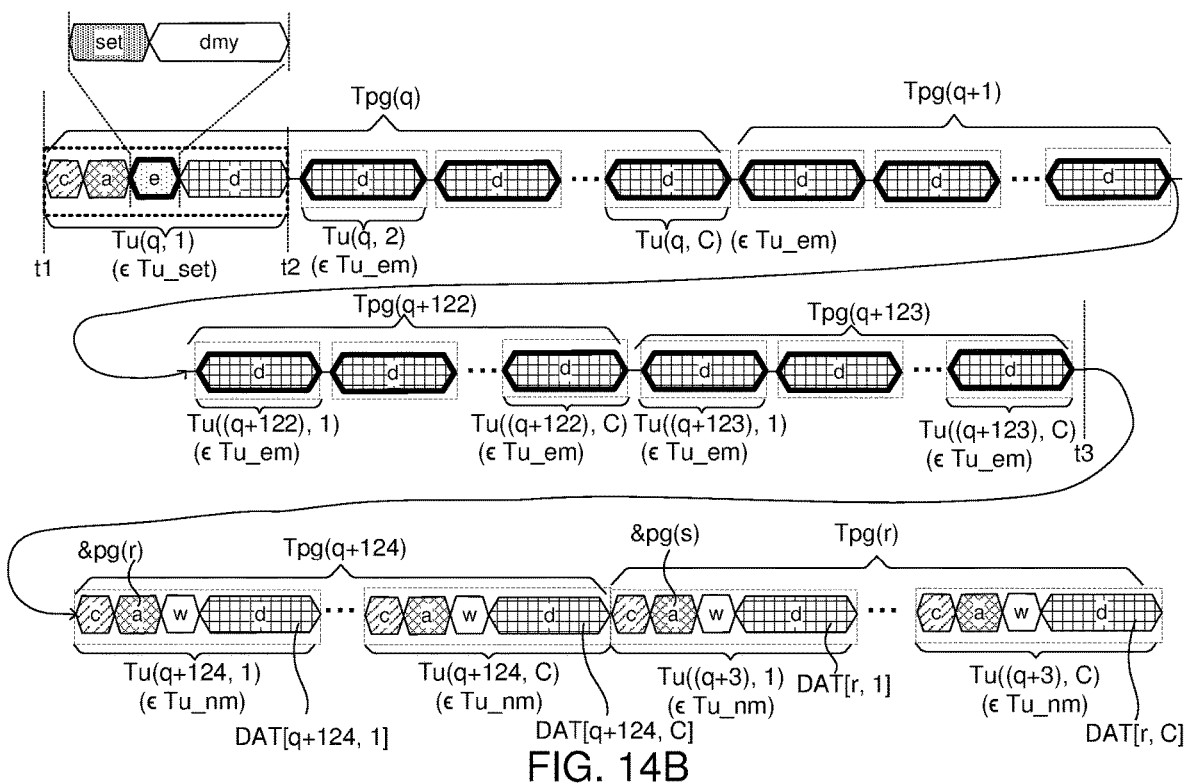
FIG. 14B is a schematic diagram illustrating how the page data are read in the read operation in response to the transitions of the chip selection signal #CS in FIG. 14A.

FIG. 14B is a schematic diagram illustrating how the page data are read in the read operation in response to the transitions of the chip selection signal #CS in FIG. 14A. Please refer to FIGS. 14A and 14B together.

The page-read durations Tpg(q), Tpg(q+1), Tpg(q+122), Tpg(q+123), Tpg(q+124), Tpg(r) and the time points t1, t2, t3 are shown. In FIG. 14B, it is assumed that the page addresses &pg(q)~&pg(q+124), are consecutive, and the page addresses &pg(q+124), &pg(r) are inconsecutive. The time points t1, t2, t3 in FIG. 14B are corresponding to the ones in FIG. 14A.

Each of the page-read durations Tpg(q), Tpg(q+1), Tpg(q+122), Tpg(q+123), Tpg(q+124), Tpg(r) includes C unit-fetching durations. For example, the page-read duration Tpg(q) includes the unit-fetching durations Tu(q, 1), Tu(q, 2) .... Tu(q, C). The constitutions of the page-read durations Tpg(q+1), Tpg(q+2), Tpg(q+3), Tpg(r), Tpg(r+1) and the details are omitted.

In the page-read duration Tpg(q), the waiting cycles in the unit-fetching duration Tu(q, 1) include the setting cycles (set) and the dummy cycles (dmy). According to the setting cycles of the unit-fetching duration Tu(q, 1), the control logic 131 realizes that the host device 11 will initiate the enhanced unit-fetching mode.

In the duration starting from the unit-fetching duration Tu(q, 2) in the page-read duration Tpg(q) to the last unit-fetching duration Tu(q+123, C) of the page-read duration Tpg(q+123), the host device 11 stops transmitting the read cycles (c), the address cycles (a), and the waiting cycles (w) to the control logic 131. Alternative speaking, the unit-fetching durations in the enhanced unit-fetching mode Tu_em include only data cycles (d). The data cycles (d) in the unit-fetching durations in the enhanced unit-fetching mode Tu_em are shown in bold lines. Apparently, the unit-fetching durations in the enhanced unit-fetching mode Tu_em become much shorter than the unit-fetching durations in the enhanced unit-fetching mode Tu_nm, and the read operation can be performed faster. Such a control mechanism is applicable because the page addresses of the data to be read are consecutive, and the control logic 131 does not need to acquire the address information from the host device 11. As the command cycles, the address cycles, and the waiting cycles are all eliminated in the enhanced unit-fetching mode, the transmission speed of the read operation is accelerated.

Once the host device 11 intends to read the data from the inconsecutive, the host device 11 drops the voltage of the chip selection signal CS#. The transition of the chip selection signal CS# (from the high logic level to the low logic level) informs the control logic 131 that the enhanced unit-fetching mode is about to end.

In FIG. 14B, as the page addresses &pg(q+123), &pg(r) are inconsecutive, the enhanced unit-fetching mode should be suspended by the end of the unit-fetching duration Tu(q+123). As shown in FIG. 14A, the chip selection signal CS# changes to the low logic level at the time point t3. The time point t3 in FIG. 14B is the end of the unit-fetching duration Tu(q+1, 3). Therefore, the read operation switches to the normal unit-fetching mode after the time point t3.

Later, in the page-read duration Tpg(q+124), each of the unit-fetching durations Tu(q+124, 1)~Tu(q+124, C) includes the command cycles (c), the address cycles (a), the waiting cycles (w), and the data cycles (d). During the page-read duration Tpg(q+124), the page data DAT[q+124] are divided and respectively read in unit-fetching durations Tu(q+124, 1)~Tu(q+124, C). The page-read duration Tpg(q+124) is utilized to transfer the page address corresponding to the next page-read duration. The address cycles of these unit-fetching durations Tu(q+124, 1)~Tu(q+124, C) indicate the next page address, that is, the page address &pg(r).

In this example, the unit-fetching durations in the enhanced unit-fetching mode (the duration between the time point t2 and the time point t3) do not include the command cycles, the address cycles, nor the waiting cycles. Consequentially, the overall duration required for performing the read operations is shortened. For the read data being stored at the consecutive page addresses, the enhanced unit-fetching mode shown in FIGS. 14A and 14B can be applied. Alternatively speaking, such enhanced unit-fetching mode is suitable for the read operations to be performed to consecutive page addresses.

In the specification, some examples of the predefined protocol(s) being adapted in the enhanced unit-fetching mode are illustrated. The implementation and details of the predefined protocols are not limited to the above examples.

As illustrated above, the read operations according to the embodiment of the present disclosure are performed in acquisition-units, and the page addresses of the data to be read from the NAND flash memory can be randomly determined by the host device 11. Therefore, the NAND flash memory 133 can replace the NOR flash memory on many occasions, and the circuit area and the cost of the memory device can be dramatically reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, electrically connected to a host device, comprising:
    a NAND flash memory, comprising:
        a first physical page corresponding to a first-page address, comprising a plurality of first acquisition-units, wherein data stored at the plurality of first acquisition-units are defined as first page data; and
        a second physical page corresponding to a second-page address, comprising a plurality of second acquisition-units, wherein data stored at the plurality of second acquisition-units are defined as second page data, and the first page data are different from the second page data; and
    a control logic, electrically connected to the NAND flash memory, configured to receive the first-page address and the second-page address from the host device during a first page-read duration and a second page-read duration, respectively, wherein the first page data and the second page data are transferred to the host device during the second page-read duration and a third page-read duration, respectively.

2. The memory device according to claim 1, wherein a size of the first physical page is equivalent to a size of the second physical page, and sizes of the plurality of first acquisition-units are equivalent to sizes of the plurality of second acquisition-units.

3. The memory device according to claim 1, wherein when the first-page address and the second-page address are consecutive, the first page-read duration is longer than or equivalent to the second page-read duration.

4. The memory device according to claim 1, wherein when the first-page address and the second-page address are inconsecutive, the first page-read duration is equivalent to the second page-read duration.

5. The memory device according to claim 1, wherein
    the first page-read duration comprises a plurality of first unit-fetching durations;
    the second page-read duration comprises a plurality of second unit-fetching durations; and
    the third page-read duration comprises a plurality of third unit-fetching durations.

6. The memory device according to claim 5, wherein when a number of the plurality of first acquisition-units is equivalent to a number of the plurality of second unit-fetching durations, the data stored at each of the plurality of first acquisition-units are respectively transferred in each of the plurality of second unit-fetching durations.

7. The memory device according to claim 5, wherein when a number of the plurality of first acquisition-units is greater than a number of the plurality of second unit-fetching durations,
    at least one of the data stored at the plurality of first acquisition-units is transferred to the host device more than once during the second page-read duration.

8. The memory device according to claim 5, wherein when a number of the plurality of first acquisition-units is less than a number of the plurality of second unit-fetching durations, the data stored at the plurality of second acquisition-units are not transferred to the host device during the third page-read duration.

9. The memory device according to claim 8, wherein a default value is transferred to the host device during the third page-read duration; or
    a randomly acquired value is transferred to the host device during the third page-read duration.

10. The memory device according to claim 5, wherein
    each of the plurality of second unit-fetching durations comprises a plurality of first data cycles for transmitting the data stored at the first physical page to the host device; and
    each of the plurality of third unit-fetching durations comprises a plurality of second data cycles for transmitting the data stored at the second physical page to the host device.

11. The memory device according to claim 5, wherein
    each of the plurality of first unit-fetching durations comprises a plurality of first address cycles representing the first-page address; and
    each of the plurality of second unit-fetching durations comprises a plurality of second address cycles representing the second-page address.

12. The memory device according to claim 5, wherein at least one of the plurality of first unit-fetching durations comprises a plurality of command cycles to indicate that a read command is performed.

13. The memory device according to claim 5, wherein each of the plurality of first unit-fetching durations comprises a plurality of waiting cycles.

14. The memory device according to claim 13, wherein the plurality of waiting cycles of one of the plurality of first unit-fetching durations comprise at least one setting cycle.

15. The memory device according to claim 14, wherein the at least one setting cycle specifies a predefined number of consecutive page addresses.

16. The memory device according to claim 15, wherein the plurality of first unit-fetching durations are longer than the plurality of second unit-fetching durations.

17. The memory device according to claim 13, wherein the plurality of waiting cycles of one of the plurality of first unit-fetching durations comprise at least one dummy cycle.

18. The memory device according to claim 1, further comprising:
    a data register, electrically connected to the control logic and the NAND flash memory; and
    a cache register, electrically connected to the control logic and the data register,
    wherein the data stored at the plurality of first acquisition-units are transferred from the NAND flash memory to the cache register through the data register during the first page-read duration.

19. The memory device according to claim 18, wherein the host device reads content of the cache register during the second page-read duration.

20. An electronic device, comprising:
a host device; and
a memory device, electrically connected to the host device, comprising:
a NAND flash memory, comprising:
  a first physical page corresponding to a first-page address, comprising a plurality of first acquisition-units, wherein data stored at the plurality of first acquisition-units are defined as first page data; and
  a second physical page corresponding to a second-page address, comprising a plurality of second acquisition-units, wherein data stored at the plurality of second acquisition-units are defined as second page data, and the first page data are different from the second page data; and
a control logic, electrically connected to the NAND flash memory, configured to receive the first-page address and the second-page address from the host device during a first page-read duration and a second page-read duration, respectively, wherein the first page data and the second page data are transferred to the host device during the second page-read duration and a third page-read duration, respectively.

21. A read method applied to a memory device comprising a control logic and a NAND flash memory, wherein the NAND flash memory comprises a first physical page corresponding to a first-page address and a second physical page corresponding to a second-page address, wherein the first physical page comprises a plurality of first acquisition-units, the second physical page comprises a plurality of second acquisition-units, and the first page data are different from the second page data, wherein the read method comprises steps of:
  receiving the first-page address and the second-page address from a host device during a first page-read duration and a second page-read duration, respectively; and
  transferring the first page data and the second page data to the host device during the second page-read duration and a third page-read duration, respectively.

* * * * *